United States Patent
Lee et al.

(10) Patent No.: US 9,713,269 B2
(45) Date of Patent: Jul. 18, 2017

(54) FIXING STRUCTURE, ELECTRONIC DEVICE AND METHOD FOR ASSEMBLING AN ELECTRONIC DEVICE

(71) Applicant: Wistron Corporation, New Taipei (TW)

(72) Inventors: Yu-Chen Lee, New Taipei (TW); Chen-Pang Liu, New Taipei (TW); Xu Zhang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/979,538

(22) Filed: Dec. 28, 2015

(65) Prior Publication Data
US 2017/0013727 A1    Jan. 12, 2017

(30) Foreign Application Priority Data

Jul. 7, 2015 (CN) .......................... 2015 1 0398429

(51) Int. Cl.
*H05K 7/02* (2006.01)
*H05K 7/04* (2006.01)
*H05K 5/00* (2006.01)
*F16M 13/02* (2006.01)
*H05K 7/14* (2006.01)
*H05K 13/00* (2006.01)
*G02F 1/1333* (2006.01)
(Continued)

(52) U.S. Cl.
CPC ........... *H05K 5/0017* (2013.01); *F16M 13/02* (2013.01); *G02F 1/1333* (2013.01); *H05K 5/02* (2013.01); *H05K 7/1422* (2013.01); *H05K 13/0023* (2013.01); *F16B 2001/0092* (2013.01)

(58) Field of Classification Search
CPC ............... H05K 5/0017; H05K 7/1422; H05K 13/0023; F16M 13/02; F16M 2001/0092
USPC ......................................... 361/809, 807, 810
See application file for complete search history.

(56) References Cited

U.S. PATENT DOCUMENTS 7,206,038 B2 *  4/2007  Choi ..................... G06F 1/1601
                                                          349/12
7,772,488 B2    8/2010  Chen
(Continued)

FOREIGN PATENT DOCUMENTS

TW       201101267      1/2011
TW       201133062      10/2011

OTHER PUBLICATIONS

"Office Action of Taiwan Counterpart Application" with partial English translation, issued on Jun. 27, 2016, p. 1-p. 17.

*Primary Examiner* — Hung S Bui
(74) *Attorney, Agent, or Firm* — Jianq Chyun IP Office

(57) ABSTRACT

A fixing structure is suitable for fixing a display panel of an electronic device. The display panel has a panel fitting portion at a side edge of the display panel. The fixing structure includes a front bezel and a rear bracket. The front bezel has a bezel fitting portion to fit with the panel fitting portion. The rear bracket is assembled to the front bezel and has a restraining portion to restrain the motion of the bezel fitting portion relative to the panel fitting portion after the bezel fitting portion fits with the panel fitting portion and the rear bracket is fixed to the front bezel. Besides, an electronic device applied with the above fixing structure and a method for assembling the same are also provided here.

20 Claims, 6 Drawing Sheets

(51) Int. Cl.
*H05K 5/02* (2006.01)
*F16B 1/00* (2006.01)

(56) References Cited

U.S. PATENT DOCUMENTS

| | | | |
|---|---|---|---|
| 7,869,197 B2* | 1/2011 | Lee | H04N 5/64 349/58 |
| 2010/0141863 A1* | 6/2010 | Chang | G02F 1/133308 349/58 |
| 2013/0069500 A1* | 3/2013 | Chan | G06F 1/1601 312/223.1 |

* cited by examiner

ND METHOD FOR ASSEMBLING
FIXING STRUCTURE, ELECTRONIC DEVICE AND METHOD FOR ASSEMBLING AN ELECTRONIC DEVICE

CROSS-REFERENCE TO RELATED APPLICATION

This application claims the priority benefit of China application serial no. 201510398429.5, filed on Jul. 7, 2015. The entirety of the above-mentioned patent application is hereby incorporated by reference herein and made a part of this specification.

BACKGROUND OF THE INVENTION

1. Field of the Invention

The invention relates to an electronic device, and relates particularly to a fixing structure of an electronic device and a method for assembling an electronic device through a fixing structure.

2. Description of Related Art

A conventional desktop computer includes a computer host and a computer screen that are independent of each other. However, this independent configuration occupies a large amount of space and therefore an all-in-one computer has been presented. The all-in-one computer integrates the computer host and the computer screen into one machine casing, wherein a CD-ROM drive, speaker and such peripheral devices may be built-in selectively. The all-in-one computer has an external appearance similar to a conventional computer screen but typically has a larger thickness for accommodating a motherboard and such components.

Regarding the configuration of components, the all-in-one computer includes a transparent panel/touch panel (namely a transparent panel with a touch module), a display panel (for example an LCD panel), a front bezel, a rear bracket and a rear casing. Referring to FIG. 5, generally speaking, the display panel (reference may also be made to a display panel 204 in FIG. 6) is disposed so as to be sandwiched between a front bezel 201 and a rear bracket 202, wherein a screw driver is used to turn a screw 203 in a fastening direction B, so as to fasten the rear bracket 202 to a side edge of the display panel through the screw 203. However, in order to fasten the screw 203 in the fastening direction B, a reinforcing rib 201a formed on the front bezel 201 is required to be cut off near the screw 203 and cannot be continuous, therefore the structural strength of the front bezel 203 is lowered.

Referring to FIG. 6, the difference with the all-in-one computer of FIG. 5 is that in order to absorb margins (tolerance) during assembly, the rear bracket 202 further has an elastic side 202a, and the screw 203 fastens the elastic side 202a of the rear bracket 202 to a side edge of the display panel 204. However, a portion of the rear bracket 202 is removed in order to form the elastic side 202a, which also lowers the structural strength of the rear bracket 202. In addition, regardless of the example in FIG. 5 or FIG. 6, the number of work stations and fixtures of an assembly line is required to increased to perform fastening of the screw, therefore the manufacturing cost of the product is increased.

SUMMARY OF THE INVENTION

The invention provides a fixing structure for fixing a display panel of an electronic device.

The invention provides an electronic device wherein a display panel thereof may be fixed easily.

The invention provides method for assembling an electronic device for fixing a display panel of an electronic device.

The invention provides a fixing structure, adapted for fixing a display panel of an electronic device. The display panel has a panel fitting portion at a side edge of the display panel. The fixing structure includes front bezel and a rear bracket. The front bezel has a bezel fitting portion to fit with the panel fitting portion. The rear bracket is assembled to the front bezel and has a restraining portion to restrain a motion of the bezel fitting portion relative to the panel fitting portion after the bezel fitting portion is fitted with the panel fitting portion and the rear bracket is fixed to the front bezel.

The invention provides an electronic device including a panel, a display panel, a front bezel and a rear bracket. The display panel is fixed to the panel and has a panel fitting portion at a side edge of the display panel. The front bezel is fixed to the panel and has a bezel fitting portion to fit with the panel fitting portion. The rear bracket is assembled to the front bezel and has a restraining portion to restrain a motion of the bezel fitting portion relative to the panel fitting portion after the bezel fitting portion is fitted with the panel fitting portion and the rear bracket is fixed to the front bezel.

The invention provides a method for assembling an electronic device including the following steps. A display panel is fixed to a panel. A front bezel is fixed to the panel, such that a bezel fitting portion of the front bezel fits with a panel fitting portions of the display panel. A rear bracket is fixed to the front bezel, such that a restraining portion of the rear bracket limits a motion of the bezel fitting portion relative to the panel fitting portion.

Based on the above, under the conditions where a conventional screw for fastening is not used, the invention may ensure the positioning between the front bezel and the display panel by the fitting between the bezel fitting portions and the panel fitting portions, and ensure the fitting between the bezel fitting portions and the panel fitting portions through the restraining portions. As such, the invention does not use the conventional screw for fastening and therefore component cost and manufacturing time may be reduced.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
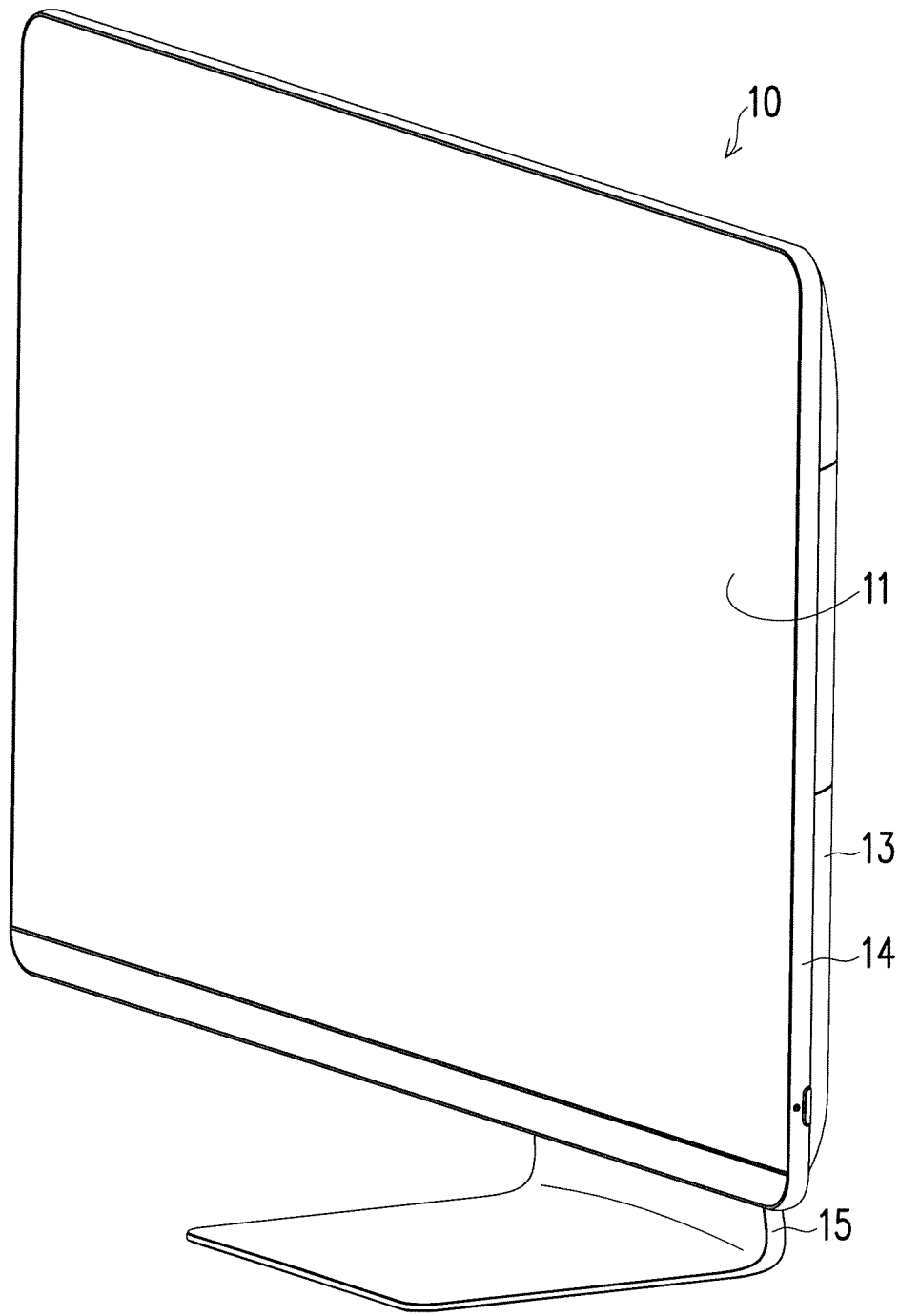
FIG. 1 is a three-dimensional diagram illustrating an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
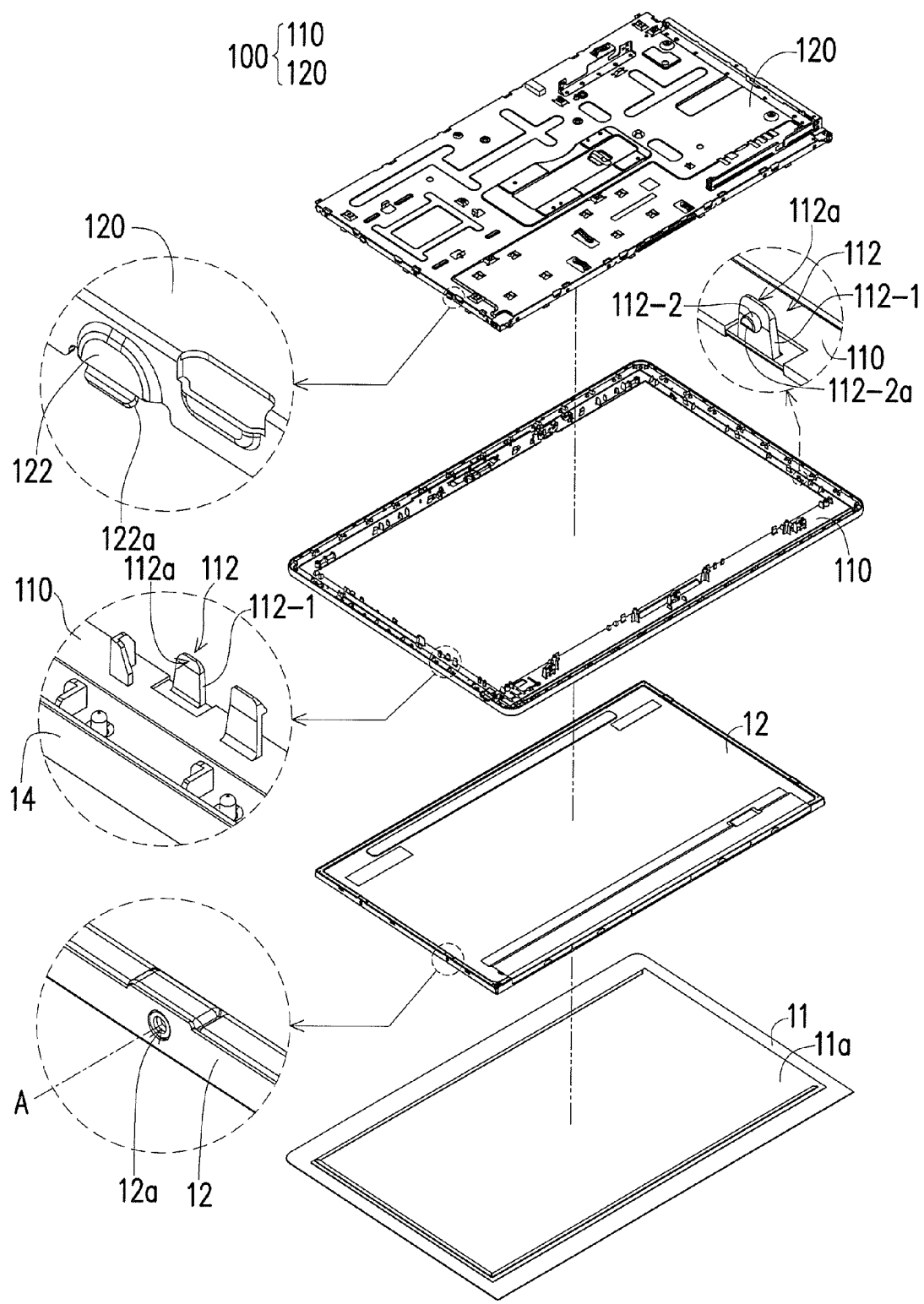
FIG. 2 is an exploded view illustrating partial components of the electronic device of FIG. 1.

Referring to FIG. 1 and FIG. 2, in the present embodiment, an electronic device 10 includes a panel 11, a display panel 12 and a fixing structure 100. The panel 11, for example, is a transparent panel or a panel having a transparent region for an image to penetrate. The display panel 12 (for example a liquid crystal display panel 12) is fixed to the panel 11. The fixing structure 100 is assembled to the panel 11, so as to fix the display panel 12 through an arrangement of the fixing structure 100 with the panel 11. More specifically, the fixing structure 100 includes a front bezel 110 and a rear bracket 120. The front bezel 110 is fixed to the panel 11. The rear bracket 120 is fixed to the front bezel 110 so as to fix to the panel 11 through the front bezel 110. In addition, in the present embodiment, the electronic device 10 further includes a rear casing 13 assembled to the rear bracket 120 and an ornamental frame 14 located between the panel 11 band the rear casing 13. In addition, the electronic device 10 also includes a support 15, assembled to the rear bracket 120, to support the above mentioned components. A motherboard and such components of the computer system may be installed on the rear bracket 120, such that the electronic device 10 may be an all-in-one type computer, however the invention is not limited thereto.

In addition to specifically describing the electronic device 10 of the present embodiment, a method for assembling the electronic device 10 according to an embodiment of the invention is also described below.

Figure 3A:
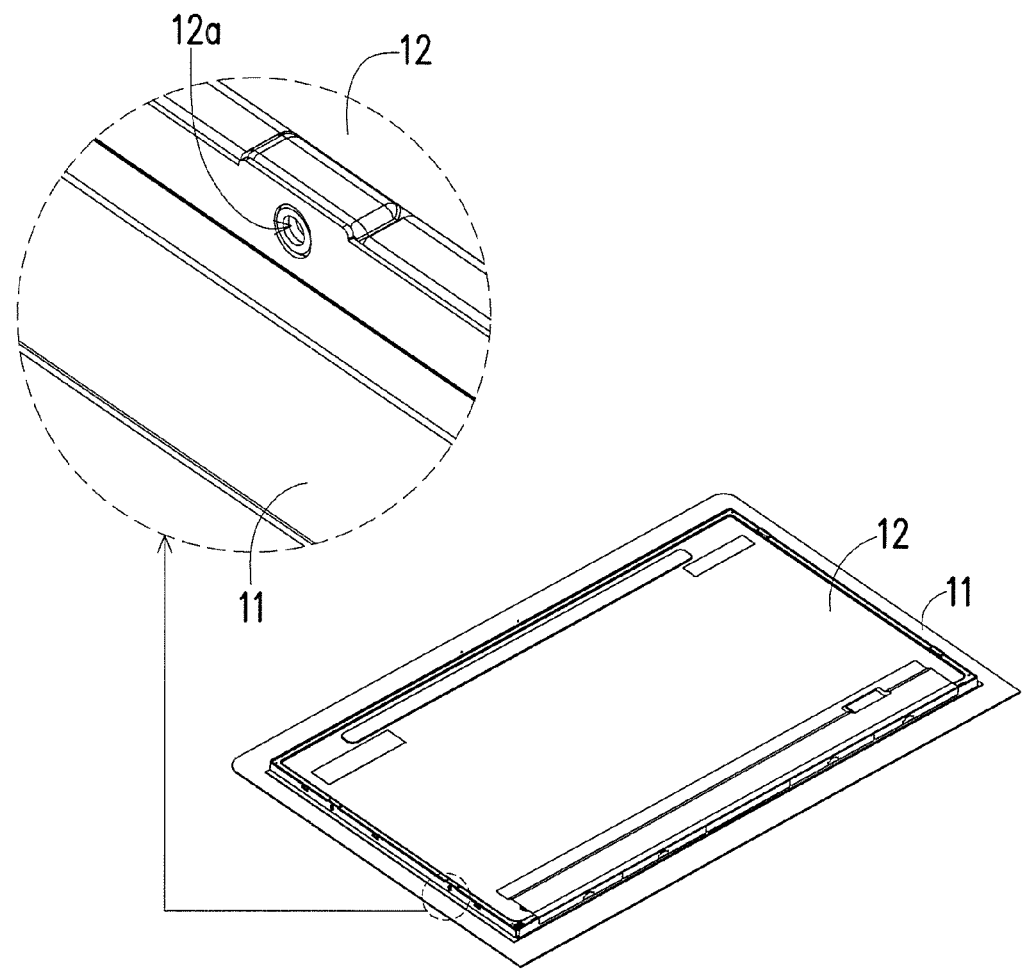
FIG. 3A is a three-dimensional diagram illustrating a display panel of FIG. 2 fixed to a panel.
Figure 4A:
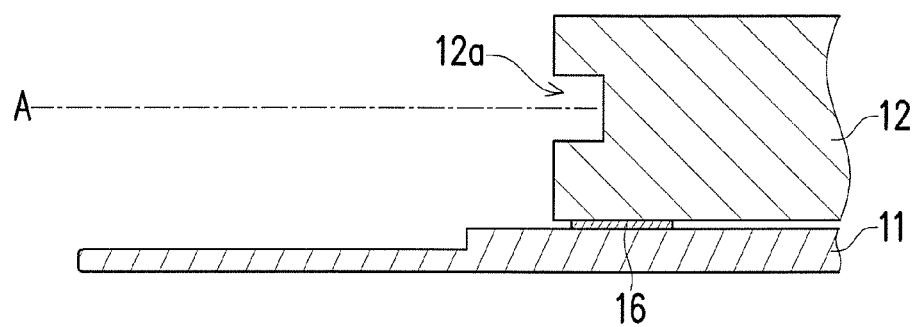
FIG. 4A to FIG. 4C are partial cross-sectional diagrams illustrating partial components of the electronic devices of FIG. 3A to FIG. 3C respectively.

Referring to FIG. 2, FIG. 3A and FIG. 4A, according to the method for assembling of the present embodiment, at first, the display panel 12 is fixed to the panel 11. For example, the display panel 12 may be adhered to the panel 11 through a foam tape 16, as shown in FIG. 4A. In the present embodiment, according to actual needs, the electronic device 10 may include a touch module 11*a*, which is already disposed on the panel 11. Therefore, after the display panel 12 is fixed to the panel 11, the touch module 11*a* is located between the panel 11 and the display panel 12.

Figure 3B:
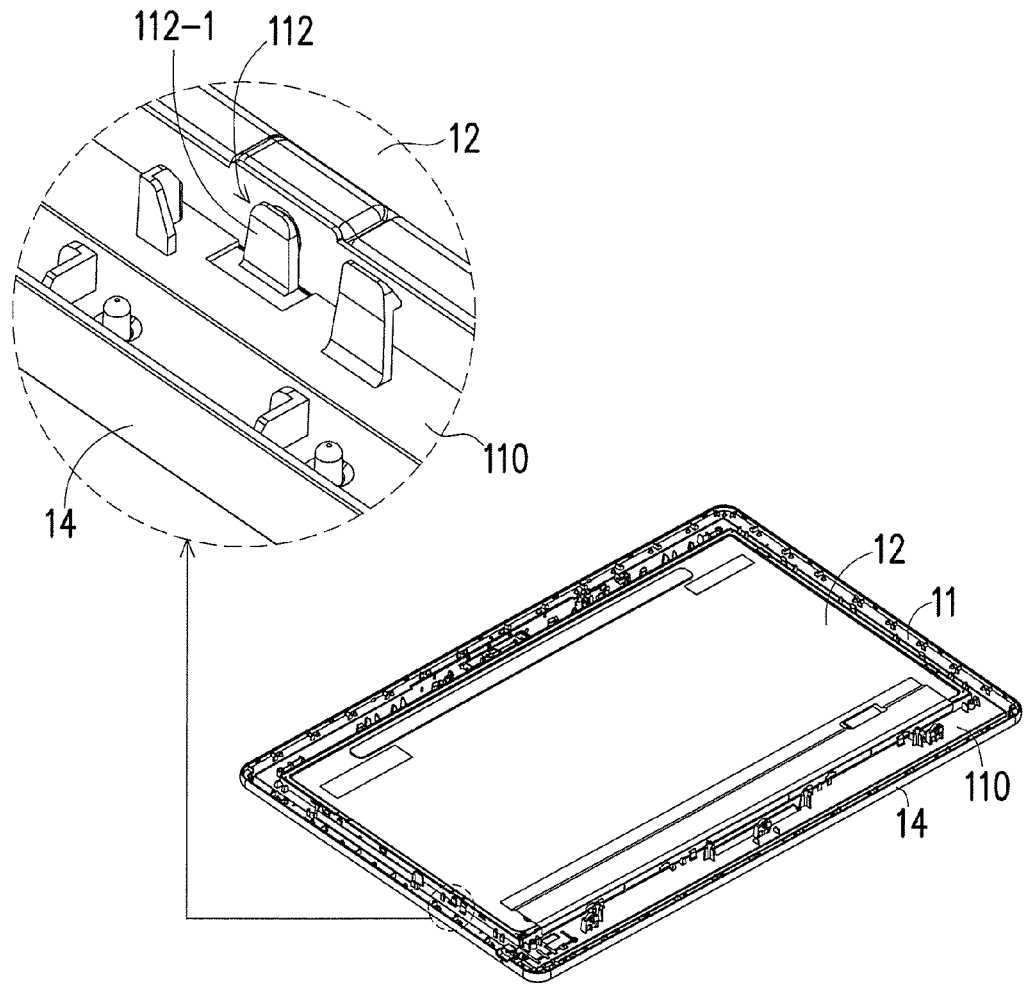
FIG. 3B is a three-dimensional diagram illustrating a front bezel of FIG. 2 fixed to a panel.
Figure 4B:
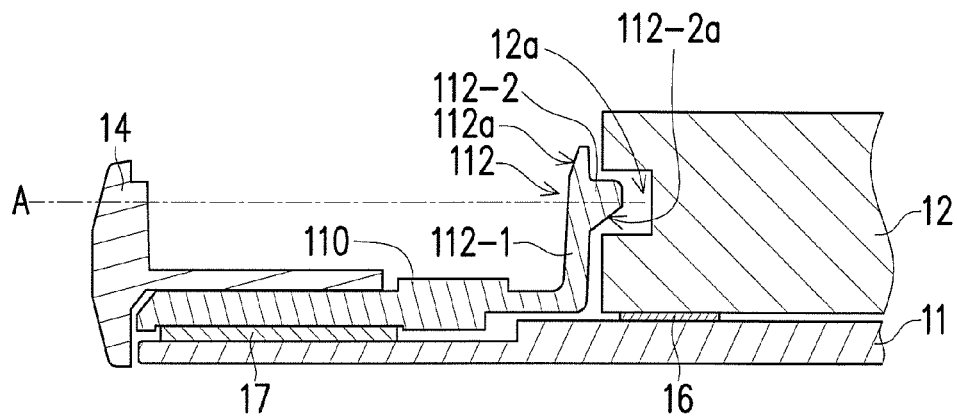

Referring to FIG. 2, FIG. 3B and FIG. 4B, according to the method for assembling of the present embodiment, the front bezel 110 is then fixed to the panel 11. For example, the front bezel 110 may be adhered to the panel 11 through a double sided tape 17, as shown in FIG. 4B. In the present embodiment, the display panel 12 has a plurality of panel fitting portions 12*a* at two opposite side edges of the display panel 12, and the front bezel 110 has a plurality of bezel fitting portions 112. The bezel fitting portions 112 fit with the panel fitting portions 12*a* respectively. In the present embodiment, the panel fitting portions 12*a* of the display panel 12 are a plurality of holes located at two opposite side edges of the display panel 12, wherein the holes were originally used for fastening a fastening component (for example a screw). Each of the bezel fitting portions 112 may have an elastic piece 112-1 and a protruding pillar 112-2.

The elastic piece 112-1 extends from the front bezel 110. The protruding pillar 112-2 protrudes from the corresponding elastic piece 112-1 to fit with the corresponding hole (namely the panel fitting portions 12*a*). In addition, the protruding pillar 112-2 may have a protruding pillar guiding surface 112-2*a* presses the elastic piece 112-1 with respect to the front bezel 110 until the protruding pillar 112-2 fits with the hole during a process of fitting the protruding pillar 112-2 with the hole.

It should be noted, in the present embodiment, the ornamental frame 14 is already connected to the front bezel 110, and a center axis A of the hole (namely the panel fitting portion 12*a*) and a portion of the ornamental frame 14 overlap. As such, a screwdriver cannot be used to fasten the front bezel 110 to the side edge of the display panel 12 through a screw. Therefore, under the conditions where a conventional screw for fastening is not used, a positioning between the front bezel 110 and the display panel 12 is ensured through the fitting of the bezel fitting portions 112 with the panel fitting portions 12*a* respectively. At the same time, not using the conventional screw for fastening may reduce component cost and manufacturing time.

Figure 3C:
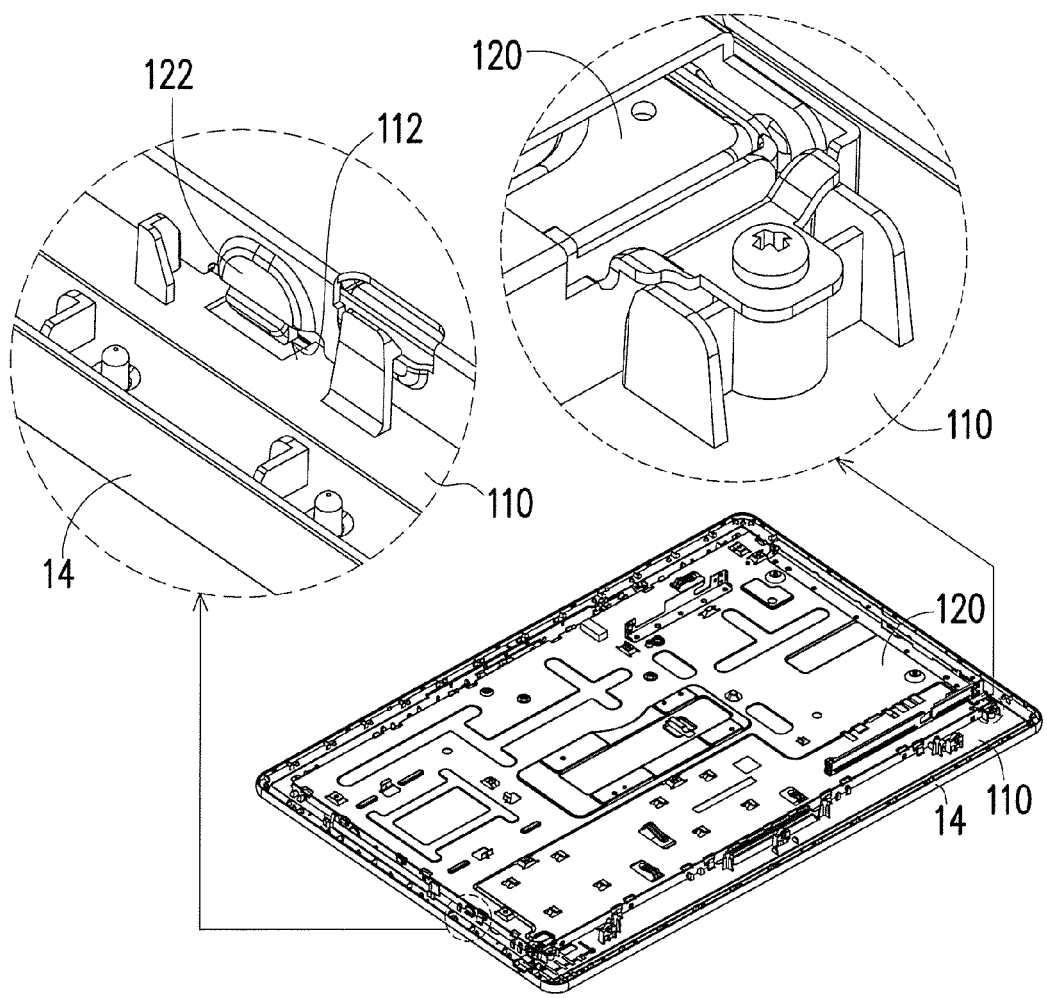
FIG. 3C is a three-dimensional diagram illustrating a rear bracket of FIG. 2 fixed to a front bezel.
Figure 4C:
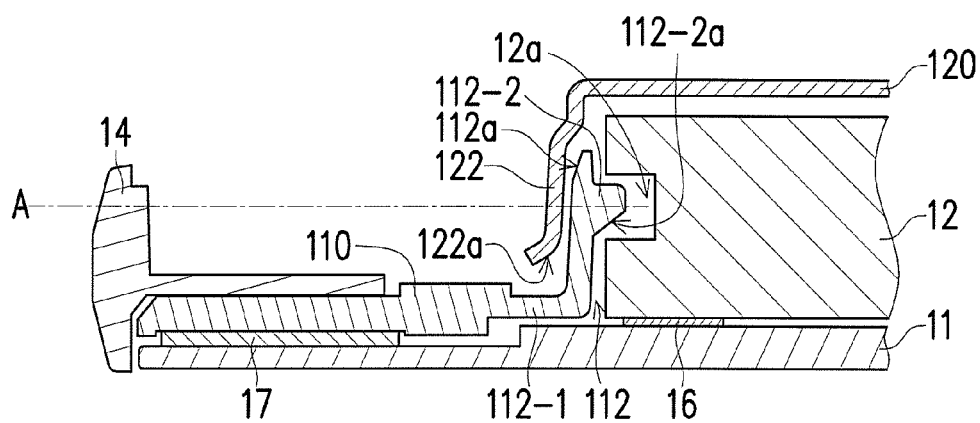
Figure 5:
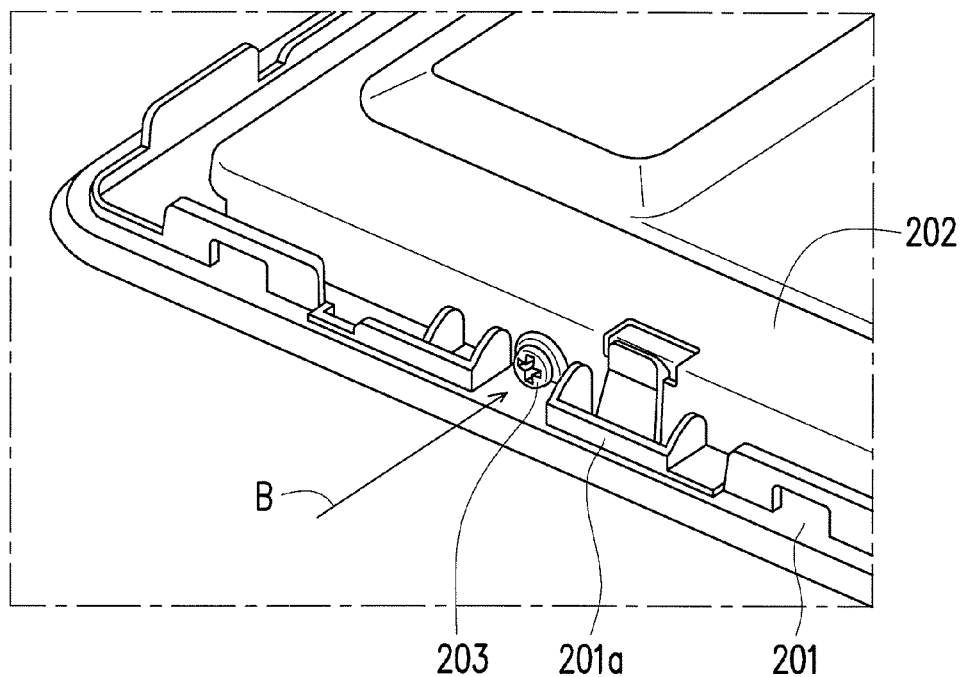
FIG. 5 is a three-dimensional diagram illustrating a partial rear view of a conventional all-in-one computer with a rear casing omitted.
Figure 6:
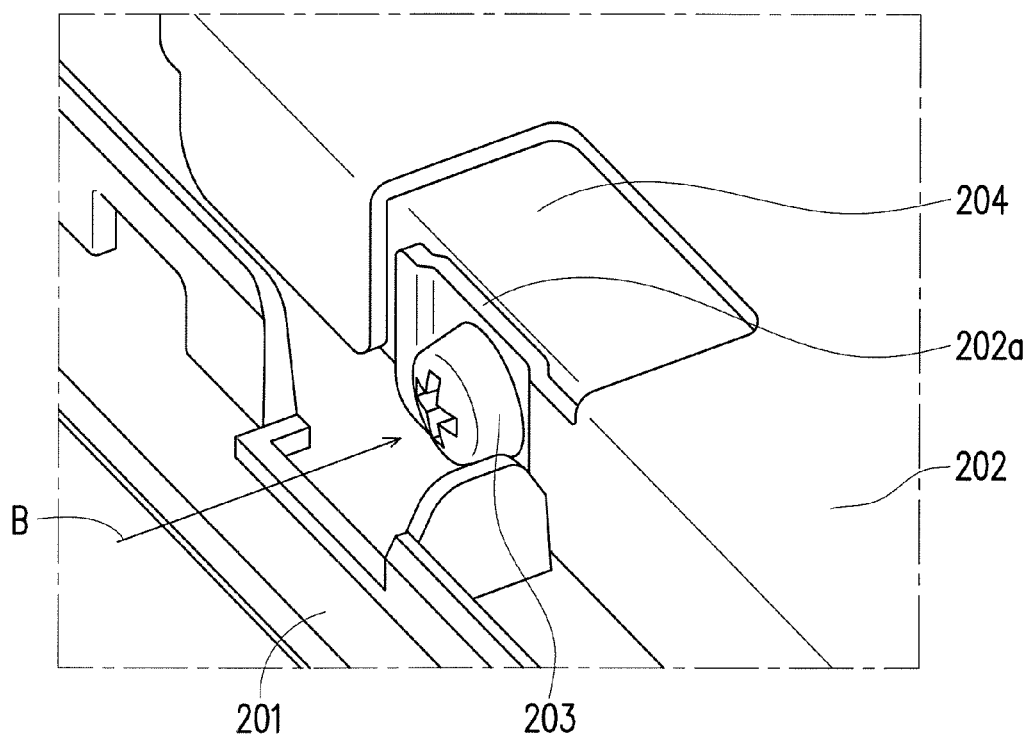
FIG. 6 is a three-dimensional diagram illustrating a partial rear view of another conventional all-in-one computer with a rear casing omitted.

Referring to FIG. 2, FIG. 3C and FIG. 4C, according to the method for assembling of the present embodiment, the rear bracket 120 is then fixed to the front bezel 110, such that the display panel 12 is located between the front bezel 110 and the rear bracket 120. In the present embodiment, the rear bracket 120 may be fastened to the front bezel 110 through a plurality of screws, as shown in the upper right magnified portion of FIG. 3C, however the invention is not limited thereto. In addition, in the above mentioned step of fixing the front bezel 110 to the panel 11, a fitting between the bezel fitting portions 112 and the panel fitting portions 12*a* may ensure the positioning between the front bezel 110 and the display panel 12.

However, in order to ensure that the bezel fitting portions 112 will not separate from the panel fitting portions 12*a* during drop testing or actual use, the rear bracket 120 has a plurality of restraining portions 122, and each of the restraining portions 122 may be constituted from a portion of the rear bracket 120, for example a, a bump formed at a side portion of the rear bracket 120. Therefore, after the rear bracket 120 is fixed to the front bezel 110, each of the restraining portions 122 may restrain the motion of the corresponding bezel fitting portion 112 relative to the corresponding panel fitting portion 12*a*, so as to ensure a fitting between the bezel fitting portions 112 and the panel fitting portions 12*a*. In the present embodiment, the panel fitting portions 12*a*, the bezel fitting portions 112 and the restraining portions 122 appear in pairs on the left side and the right side of the rear bracket 120 of FIG. 3C, wherein the components of the bottom left corner are described as an example, and the upper left corner, the upper right corner and the lower right corner also have similar components and will not be repeated here.

In the present embodiment, the bezel fitting portions 112 may have a bezel guiding surface 112*a*, which guides the motion of the restraining portions 122 with respect to of the front bezel 110 during a process of assembling the rear bracket 120 and the front bezel 110. In the present embodiment, the bezel guiding surface 112*a* is formed on the elastic piece 112-1. Similarly, the restraining portions 122 may also have a restraining guiding surface 122*a*, which guides the motion of the restraining portions 122 with respect to of the front bezel 110 during a process of assembling the rear bracket 120 and the front bezel 110. In the present embodiment, during the manufacturing of each of the restraining portions 122, an end of each of the restraining portions 122 may be bent to foam the restraining guiding surface 122a.

In summary, under the conditions where a conventional screw for fastening is not used, the invention may ensure the positioning between the front bezel and the display panel by the fitting between the bezel fitting portions and the panel fitting portions, and ensure the fitting between the bezel fitting portions and the panel fitting portions through the restraining portions. As such, the invention does not use the conventional screw for fastening and therefore component cost and manufacturing time may be reduced. In addition, since the ornamental frame which appears in response to exterior design causes the front bezel not to be able to be fastened to the display panel through a screw by using a screwdriver, the invention may ensure the positioning between the front bezel and the display panel under the conditions where a screw for fastening is not used, therefore increasing the flexibility in a design of an ornamental frame or device casing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fixing structure, adapted for fixing a display panel of an electronic device, the display panel having a panel fitting portion at a side edge of the display panel, the fixing structure comprising:
   a front bezel having a bezel fitting portion to fit with the panel fitting portion; and
   a rear bracket assembled to the front bezel and having a restraining portion to restrain a motion of the bezel fitting portion relative to the panel fitting portion after the bezel fitting portion is fitted with the panel fitting portion and the rear bracket is fixed to the front bezel, wherein the panel fitting portion is a hole, the bezel fitting portion has an elastic piece and a protruding pillar, the elastic piece extends from the front bezel, and the protruding pillar protrudes from the elastic piece to fit with the hole.

2. The fixing structure as claimed in claim 1, wherein the bezel fitting portion has a bezel guiding surface, which guides the motion of the restraining portion with respect to of the front bezel during a process of assembling the rear bracket and the front bezel.

3. The fixing structure as claimed in claim 1, wherein the bezel fitting portion has a bezel guiding surface, which guides the motion of the restraining portion with respect to of the front bezel during a process of assembling the rear bracket and the front bezel.

4. The fixing structure as claimed in claim 1, wherein the protruding pillar has a protruding pillar guiding surface, which presses the elastic piece with respect to the front bezel until the protruding pillar fits with the hole during a process of fitting the protruding pillar with the hole.

5. The fixing structure as claimed in claim 4, wherein the bezel fitting portion has a bezel guiding surface, which guides the motion of the restraining portion with respect to of the front bezel during a process of assembling the rear bracket and the front bezel.

6. The fixing structure as claimed in claim 1, wherein the restraining portion has a restraining guiding surface, which guides the motion of the restraining portion with respect to of the front bezel during a process of assembling the rear bracket and the front bezel.

7. An electronic device, comprising:
   a panel;
   a display panel fixed to the panel and having a panel fitting portion at a side edge of the display panel;
   a front bezel fixed to the panel and having a bezel fitting portion to fit with the panel fitting portion; and
   a rear bracket assembled to the front bezel and having a restraining portion to restrain a motion of the bezel fitting portion relative to the panel fitting portion after the bezel fitting portion is fitted with the panel fitting portion and the rear bracket is fixed to the front bezel.

8. The electronic device as claimed in claim 7, wherein the panel fitting portion is a hole, the bezel fitting portion has an elastic piece and a protruding pillar, the elastic piece extends from the front bezel, and the protruding pillar protrudes from the elastic piece to fit with the hole.

9. The electronic device as claimed in claim 8, wherein the protruding pillar has a protruding pillar guiding surface, which presses the elastic piece with respect to the front bezel until the protruding pillar fits with the hole during a process of fitting the protruding pillar with the hole.

10. The electronic device as claimed in claim 8, wherein the bezel fitting portion has a bezel guiding surface, which guides the motion of the restraining portion with respect to of the front bezel during a process of assembling the rear bracket and the front bezel.

11. The electronic device as claimed in claim 7, wherein the restraining portion has a restraining guiding surface, which guides the motion of the restraining portion with respect to of the front bezel during a process of assembling the rear bracket and the front bezel.

12. The electronic device as claimed in claim 7, further comprising:
   a touch module disposed on the panel and located between the panel and the display panel.

13. The electronic device as claimed in claim 7, further comprising:
   an ornamental frame connected to the front bezel, wherein the panel fitting portion is a hole, and a center axis of the hole and a portion of the ornamental frame overlap.

14. A method for assembling an electronic device, comprising:
   fixing a display panel to a panel;
   fixing a front bezel to the panel, such that a bezel fitting portion of the front bezel fits with a panel fitting portions of the display panel; and
   fixing a rear bracket to the front bezel, such that a restraining portion of the rear bracket limits a motion of the bezel fitting portion relative to the panel fitting portion.

15. The method for assembling an electronic device as claimed in claim 14, wherein in the step of fixing the front bezel to the panel, the panel fitting portion is a hole, the bezel fitting portion has an elastic piece and a protruding pillar, the elastic piece extends from the front bezel, and the protruding pillar protrudes from the elastic piece to fit with the hole.

16. The method for assembling an electronic device as claimed in claim 15, wherein in the step of fixing the front bezel to the panel, the protruding pillar has a protruding pillar guiding surface, which presses the elastic piece with respect to the front bezel until the protruding pillar fits with the hole during a process of fitting the protruding pillar with the hole.

17. The method for assembling an electronic device as claimed in claim 15, wherein in the step of fixing the front bezel to the panel, the bezel fitting portion has a bezel guiding surface, which guides the motion of the restraining portion with respect to of the front bezel during a process of assembling the rear bracket and the front bezel.

18. The method for assembling an electronic device as claimed in claim 14, wherein in the step of fixing the rear bracket to the front bezel, the restraining portion has a restraining guiding surface to guide the motion of the restraining portion with respect to of the front bezel.

19. The method for assembling an electronic device as claimed in claim 14, wherein in the step of fixing the display panel to the panel, a touch module is disposed on the panel, such that the touch module is located between the panel and the display panel.

20. The method for assembling an electronic device as claimed in claim 14, wherein in the step of fixing the front bezel to the panel, an ornamental frame is connected to the front bezel, the panel fitting portion is a hole, and a center axis of the hole and a portion of the ornamental frame overlap.

* * * * *